United States Patent
Okumura et al.

(10) Patent No.: US 11,221,559 B2
(45) Date of Patent: *Jan. 11, 2022

(54) PHOTOMASK

(71) Applicant: TOPPAN PRINTING CO., LTD., Taito-ku (JP)

(72) Inventors: Akihito Okumura, Taito-ku (JP); Hiroaki Miyaji, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/924,569

(22) Filed: Jul. 9, 2020

(65) Prior Publication Data

US 2020/0341387 A1   Oct. 29, 2020

Related U.S. Application Data

(63) Continuation of application No. PCT/JP2018/048483, filed on Dec. 28, 2018.

(30) Foreign Application Priority Data

Jan. 10, 2018 (JP) .............................. JP2018-001938

(51) Int. Cl.
*G03F 7/20* (2006.01)
*G02F 1/1335* (2006.01)

(52) U.S. Cl.
CPC .... *G03F 7/70283* (2013.01); *G02F 1/133512* (2013.01); *G03F 7/2063* (2013.01); *G03F 7/70358* (2013.01)

(58) Field of Classification Search
CPC ........ G03F 1/144; G03F 1/36; G03F 7/70283; G03F 7/70358
See application file for complete search history.

(56) References Cited

U.S. PATENT DOCUMENTS

| | | | |
|---|---|---|---|
| 2006/0119825 A1 | 6/2006 | Schmidt | |
| 2007/0031764 A1* | 2/2007 | Liou | G03F 7/0007 430/322 |
| 2011/0223393 A1* | 9/2011 | Hsiao | G03F 7/70208 428/195.1 |

FOREIGN PATENT DOCUMENTS

| | | |
|---|---|---|
| JP | 11-160887 A | 6/1999 |
| JP | 2006-165548 A | 6/2006 |

(Continued)

OTHER PUBLICATIONS

International Search Report dated Mar. 19, 2019 in PCT/JP2018/048483, filed Dec. 28, 2018, (with English Translation).

*Primary Examiner* — Steven Whitesell Gordon
(74) *Attorney, Agent, or Firm* — Oblon, McClelland, Maier & Neustadt, L.L.P.

(57) ABSTRACT

A photomask including a photomask body having a surface on which a mask pattern is formed and to be scanned and subjected to pattern transfer to a resist through a lens assembly including a connecting portion and a non-connecting portion. The mask pattern has a first region subjected to the pattern transfer at the connecting portion of the lens assembly and a second region subjected to the pattern transfer at the non-connecting portion. The mask pattern has, in at least one of the first and second regions, a corrected line width which is adjusted by calculation such that the resist is to have a target line width as designed. The corrected line width has a stepwise change in at least one of a scanning direction and a direction orthogonal to the scanning direction. The stepwise change is made by including a correction component based on a random number.

20 Claims, 16 Drawing Sheets

(56) References Cited

FOREIGN PATENT DOCUMENTS

| | | |
|---|---|---|
| JP | 2008-185908 A | 8/2008 |
| JP | 2011-187869 A | 9/2011 |
| WO | WO 2018/016485 A1 | 1/2018 |

* cited by examiner

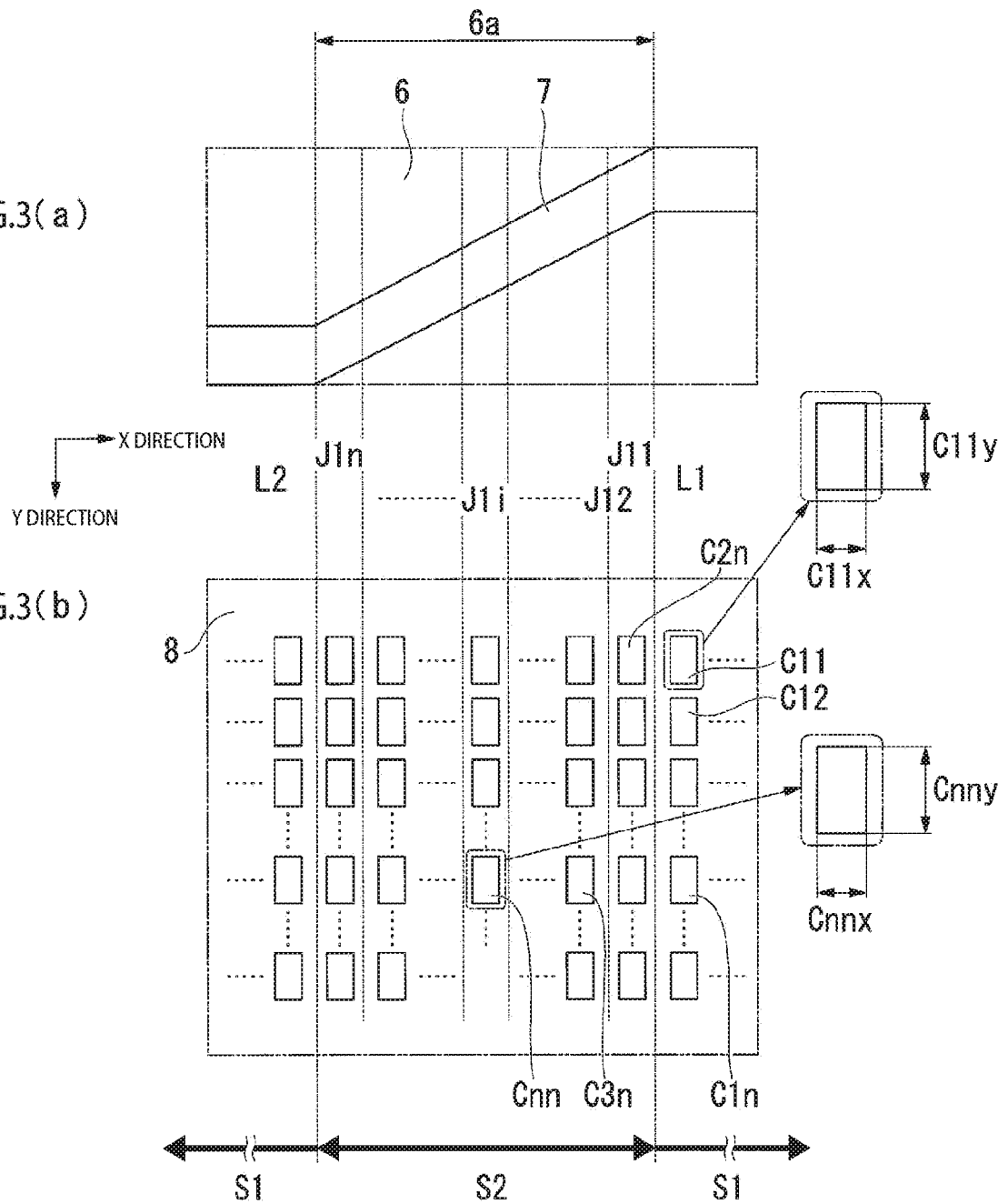

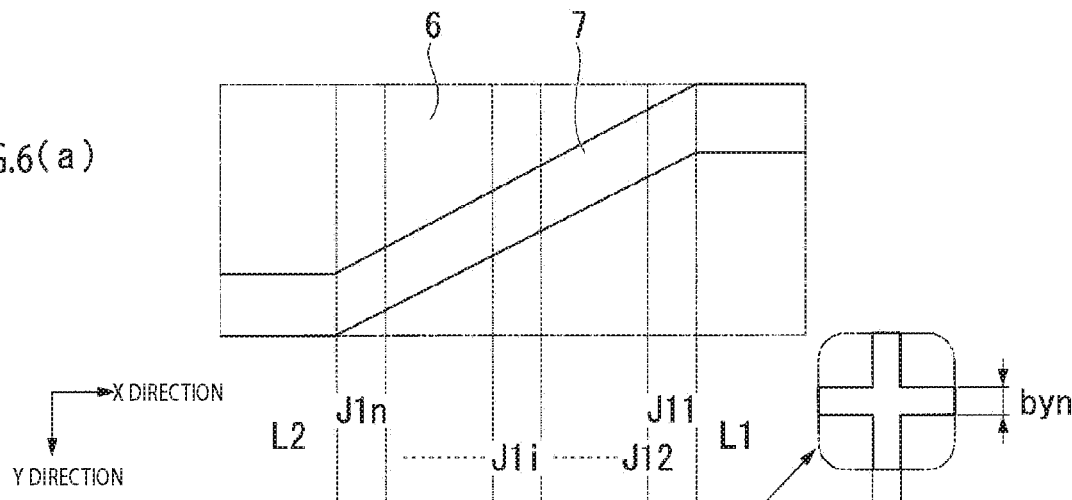
FIG.6(a)
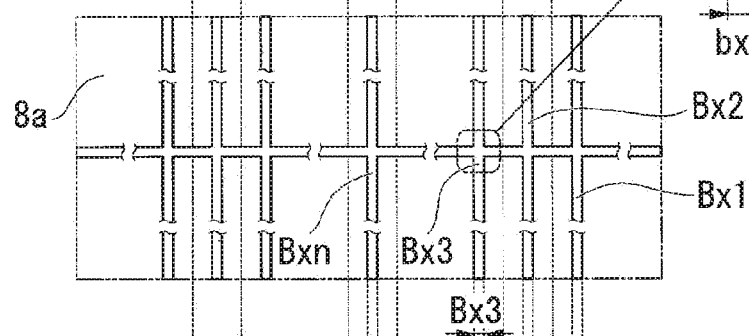
FIG.6(b)
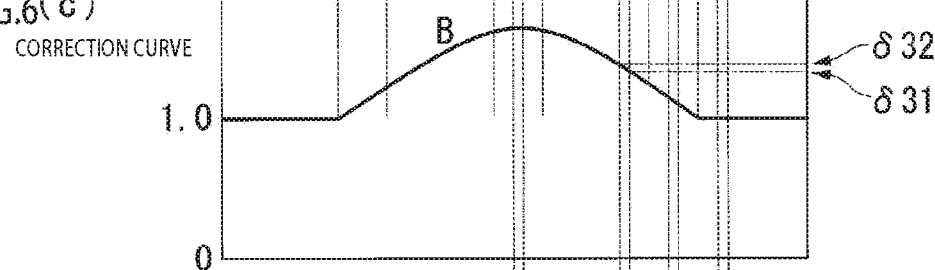
FIG.6(c) CORRECTION CURVE
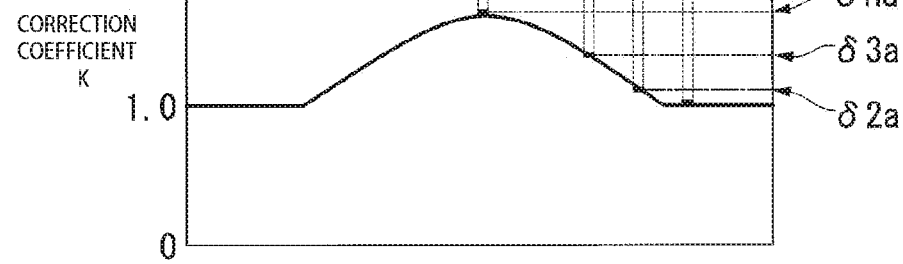
FIG.6(d) CORRECTION COEFFICIENT K

CORRECTION
COEFFICIENT K
FOR LINE WIDTH

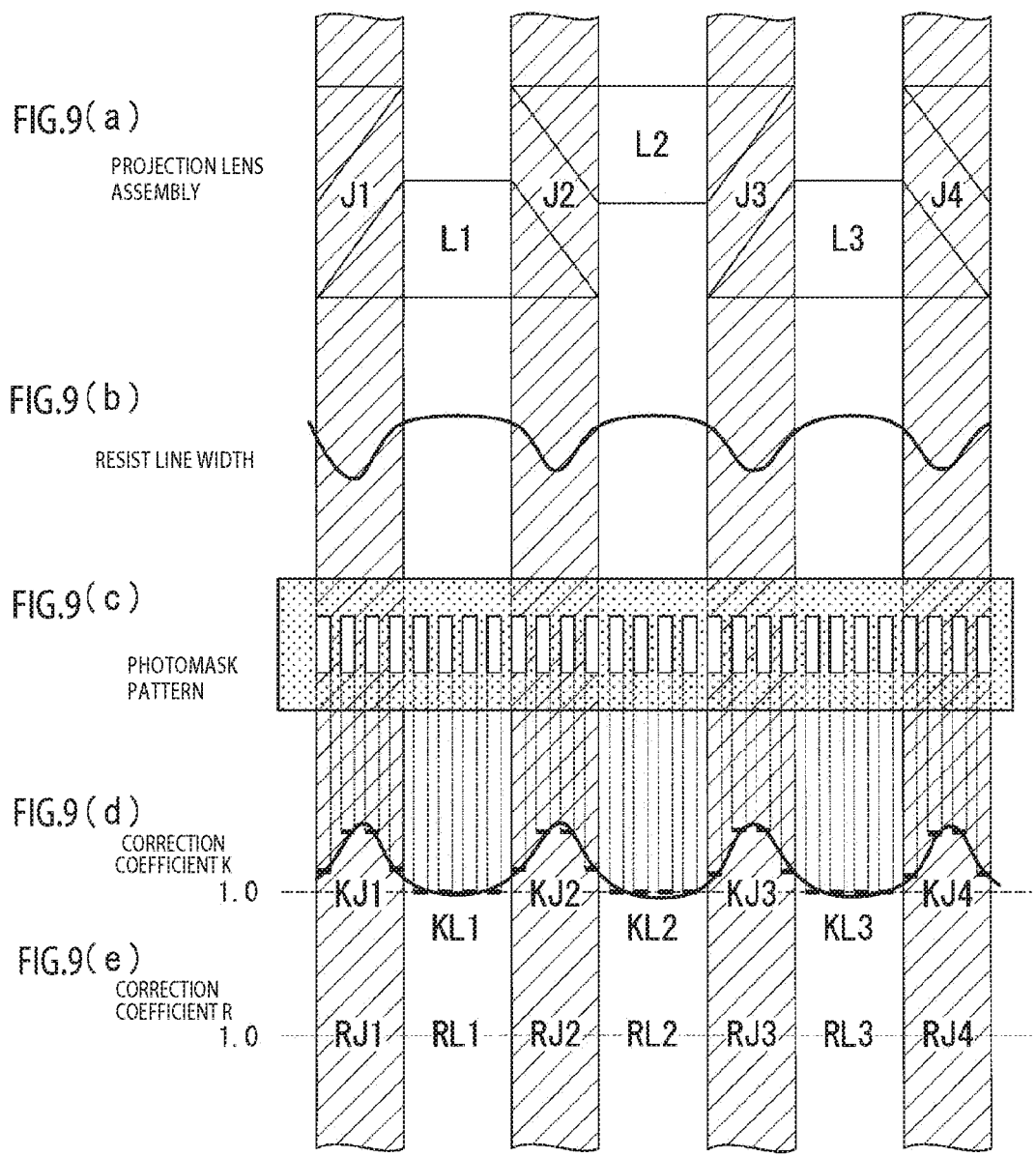

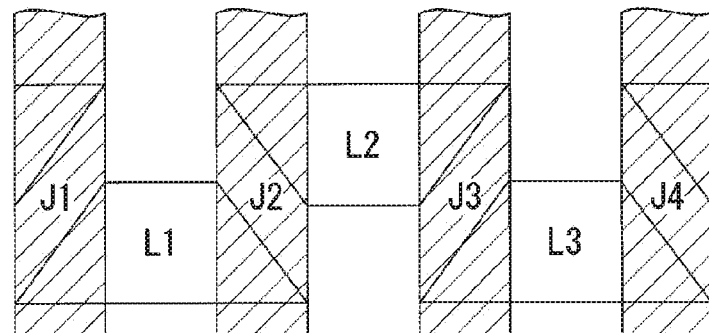

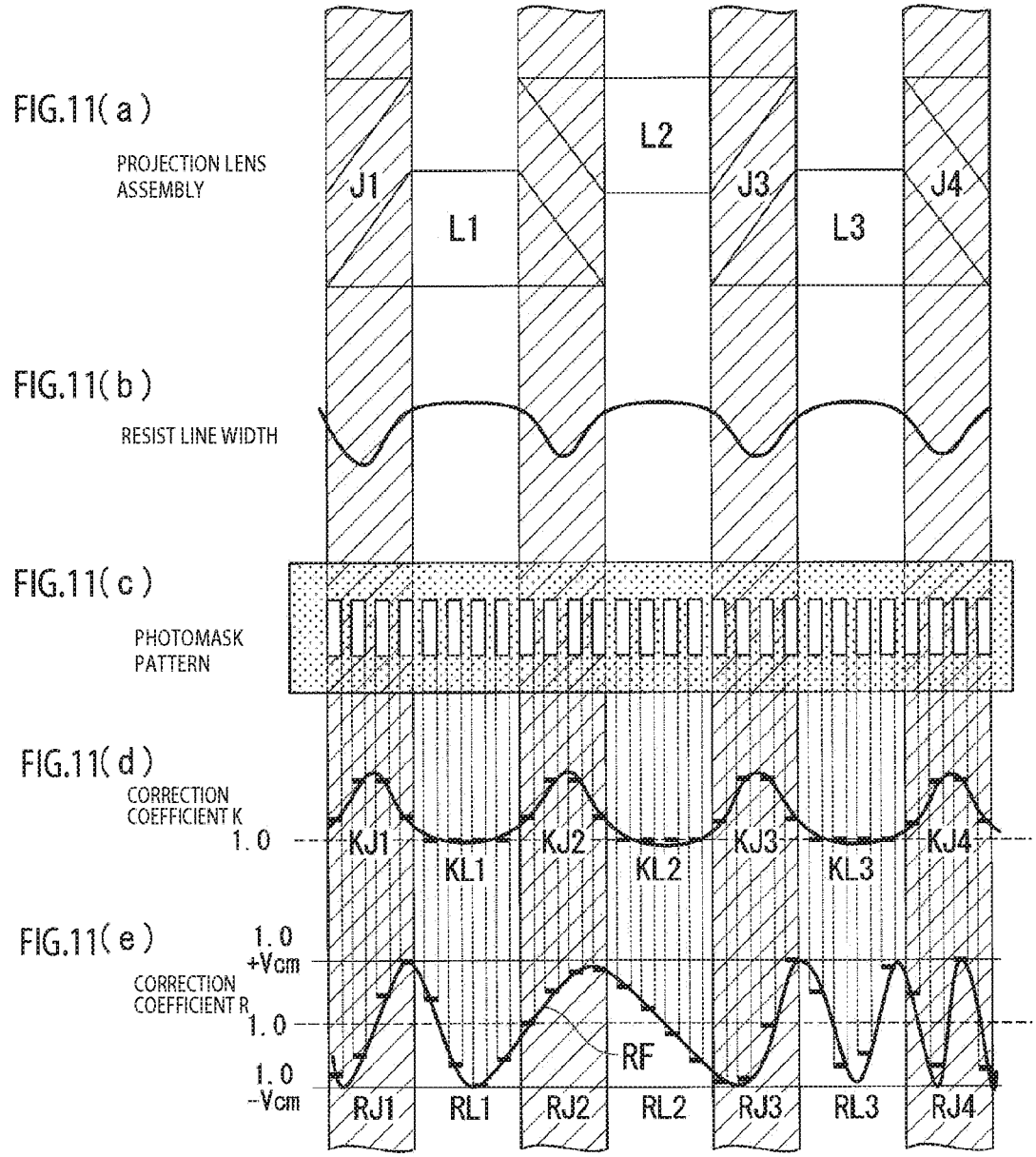

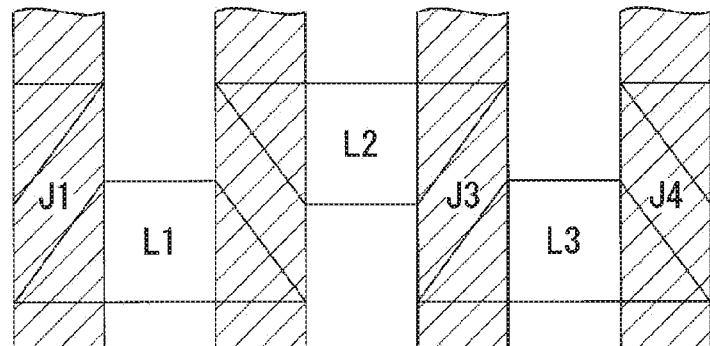
FIG.12(a)
PROJECTION LENS ASSEMBLY
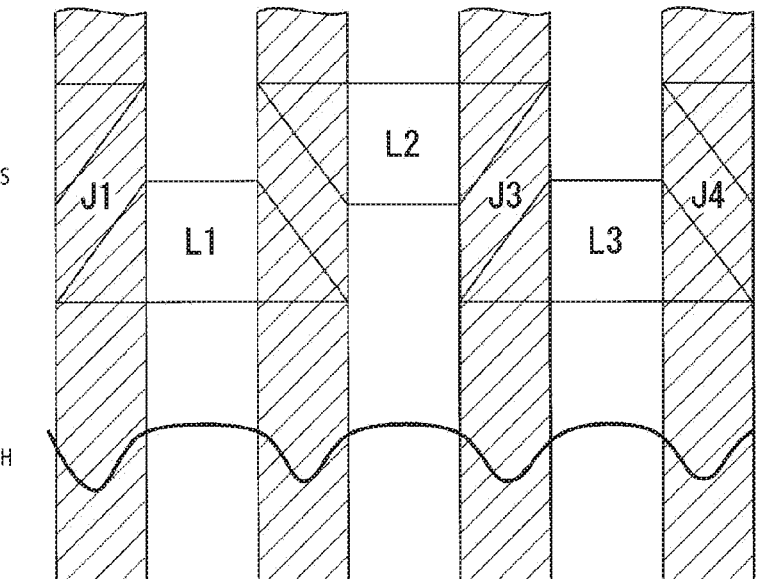
FIG.12(b)
RESIST LINE WIDTH
FIG.12(c)
PHOTOMASK PATTERN
FIG.12(d)
CORRECTION COEFFICIENT K
FIG.12(e)
CORRECTION COEFFICIENT R

PRIOR ART

PRIOR ART

PHOTOMASK

CROSS-REFERENCE TO RELATED APPLICATIONS

The present application is a continuation of International Application No. PCT/JP2018/048483, filed Dec. 28, 2018, which is based upon and claims the benefits of priority to Japanese Application No. 2018-001938, filed Jan. 10, 2018. The entire contents of all of the above applications are incorporated herein by reference.

BACKGROUND OF THE INVENTION

Field of the Invention

The present invention relates to a photomask that is provided with a projection lens array composed of lens assembly and is used for scanning type projection exposure.

Discussion of the Background

In recent years, the demand for liquid-crystal displays, particularly color liquid-crystal display panels, has remarkably increased with increases in large-sized color televisions, laptop computers, and portable electronic devices. As a color filter substrate used in a color liquid-crystal display panel, colored pixels such as a red filter, a green filter, and a blue filter, a black matrix, spacers, and the like are formed on a transparent substrate that is a glass substrate or the like through photolithography in which patterning processes such as pattern exposure using a photomask and development are performed.

In these days, enlargement of a color liquid-crystal display panel is requested, and an increase in production efficiency is also requested. Therefore, for the color filter substrate used in the color liquid-crystal display panel, increasing the size of a mother glass and efficiently producing a large multi-surface color filter substrate including many patterns for display panels are particularly important.

An alternative proposal for a color liquid-crystal display panel is a reflection type color liquid-crystal display apparatus in which elements such as colored pixels, a black matrix, a flattening layer, and spacers are formed on an array substrate (silicon substrate) with a display device formed thereon.

In producing color filter substrates for these color liquid-crystal display apparatuses, a one-shot exposure processing has often been employed using a one-shot exposure type photomask in order to achieve high productivity. However, with an increase in the size of the photomask that accompanies a further increase in the substrate size, more technical issues for manufacturing the one-shot exposure type photomask have arisen along with increasing costs; thus, the problems with one-shot exposure processing have grown serious. In view of the circumstances, there is ongoing development of a method in which, using a small, inexpensive, easily manufactured photomask, a resist (photosensitive resin solution) is applied to a substrate and then the substrate is exposed while scanning (scanning exposure method).

A solid-state image sensor incorporated in a digital camera or the like is obtained by disposing multiple image sensors on a surface of a silicon wafer substrate having a diameter of approximately 30 cm and then forming a large number of photoelectric conversion elements (CCD or CMOS), which constitute the image sensors, wiring, and the like through the wafer process. Subsequently, in order to enable color image capturing, an OCF (On Chip Filter) layer composed of colored pixels for color separation and micro-lenses is formed on the photoelectric conversion element through the photolithography. Then, in the dicing process, the wafer is cut to form a chip shaped (individual) solid-state image sensor. The development is ongoing to use the aforementioned scanning exposure method in the photolithography for forming the OCF layer.

FIG. 13 is a conceptual diagram showing the configuration of a conventional scanning exposure type projection exposure apparatus (for example, JP H11-160887 A). In the conventional projection exposure apparatus, a photomask 200 is irradiated with exposure light 110 emitted from a light source unit (not shown) installed above the photomask 200, and a resist applied to a substrate 400 is exposed via the patterned photomask 200 to form a pattern of a black matrix, colored pixels, spacers, micro-lenses, and the like. A projection lens array 300 is composed of lens assembly in which a plurality of columnar lenses are staggered, and the center of the projection lens array 300 is on the center line of the photomask 200 in a scanning direction.

For example, let us assume the case where the size of the photomask 200 is one-fourth of the size of the substrate 400, and four-region (2, 2) scanning exposure is performed in the (X, Y) directions. First, the center of the photomask 200 is moved to coincide with the center of the ¼ region of the substrate 400, and thus an initial position is determined. After that, the photomask 200 and the substrate 400 are scanned simultaneously in the Y direction with respect to the fixed projection lens array 300. Then, the pattern formed on the photomask 200 is transferred to the resist in the ¼ region of the substrate 400. The photomask 200 is moved to each of the remaining three initial positions to repeat this operation. Accordingly, the pattern is transferred to the resist on the entire substrate 400.

In the conventional projection exposure apparatus, a field stop for connecting the exposure regions of the columnar lenses is inserted into the optical path of light transmitted through the projection lens array 300. Therefore, exposure regions 600 of the projection lens array 300 are trapezoidal in plan view, and the plurality of exposure regions 600 are staggered, as shown in FIG. 14(a). FIG. 14(b) shows an enlarged view of an area around a connecting portion of a pair of adjacent columnar lenses. The adjacent exposure regions at the connecting portion are shaped so that triangular portions face each other at an end of each columnar lens, and configured so that the total amount of light transmitted through the pair of lenses as a result of scanning in the Y direction is 100 (relative value; refer to FIG. 14(b)) at any position, which is equal to the amount of light transmitted through a quadrilateral region (non-connecting portion) in the exposure region 600 that does not include a connecting portion 600a.

However, regarding line widths in the actually transferred resist pattern, there is a difference between a line width resulting from one exposure to a light amount of 100 and a line width resulting from two exposures to a total light amount of 100. For example, when the negative resist is applied, as shown FIG. 14(c), the line width resulting from two exposures is thinner than the line width resulting from one exposure, and becomes thinnest at the center of the connecting portion (portion where two exposures to light amounts 50+50 are performed). This is considered to be due to the reactivity of the resist being reduced between the end of the first exposure and the beginning of the second exposure, and thus unable to be maintained until the second exposure. The difference between the line width resulting from the first exposure and the line width resulting from the second exposure is a visually unrecognizable level. However, periodic appearance of the difference in the line width is visible as a vague tone pattern (hereinafter, unevenness) on a color filter substrate, and thus is recognized as a flaw of the display apparatus. As a countermeasure, even if, for example, the sensitivity of the resist is increased, the problem is not solved.

Specifically, with reference to FIGS. 15(a) and 15(b), the case where colored pixels for color filter substrates are formed using the conventional exposure apparatus will be described. In FIG. 15(a), the reactivity of the resist gradually decreases as L1, J11, J12, . . . toward the center of the connecting portion 600a between two columnar lenses. Therefore, when the negative resist is applied, as shown in FIG. 15(b), the line width of a colored pixel in the X direction decreases in the order of resist patterns C1kx, C2kx, . . . , Cnkx (k=1, 2, . . . , n). Similarly, the line width in the Y direction decreases in the order of resist patterns Ck1y, Ck2y, Ckny (k=1, 2, . . . n). If the positive resist is applied using a reverse mask of the negative resist, the line width becomes thicker in the above order.

FIGS. 16(a) and 16(b) show an example in which a black matrix for color filter substrates is formed using the conventional exposure apparatus. If the negative resist is applied, as shown in FIG. 16(b), a line width bx1, bx2, bxn of the black matrix in the X direction decreases in the order of resist patterns Bx1, Bx2, Bxn. Similarly, line width by1, by2, . . . , byn in the Y direction decreases in the order of resist patterns By1, By2, . . . , Byn. If the positive resist is applied using a reverse mask of the negative resist, the line width becomes thicker in the above order.

SUMMARY OF THE INVENTION

According to an aspect of the present invention, a photomask includes a photomask body having a surface on which a mask pattern is formed and to be scanned and subjected to pattern transfer to a resist through a lens assembly including a connecting portion and a non-connecting portion. The mask pattern has a first region subjected to the pattern transfer at the connecting portion of the lens assembly and a second region subjected to the pattern transfer at the non-connecting portion of the lens assembly. The mask pattern has, in at least one of the first and second regions, a corrected line width which is adjusted by calculation such that the resist is to have a target line width as designed. The corrected line width has a stepwise change in at least one of a scanning direction and a direction orthogonal to the scanning direction. The stepwise change is made by including a correction component based on a random number.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(a) is a plan view partially illustrating the shape of light transmitted through the projection lens array in the projection exposure apparatus shown in FIG. 1. FIG. 2(b) is an enlarged view of a portion of FIG. 2(a). FIG. 2(c) shows characteristics for describing a change in the line width of the negative resist pattern formed by scanning exposure with respect to an X-direction position.

FIGS. 3(a) and 3(b) are diagrams for describing a situation in which colored pixels are formed using the projection exposure apparatus shown in FIG. 1, in which FIG. 3(a) shows a partially enlarged view of the shape of light transmitted through the projection lens array, and FIG. 3(b) shows a partially enlarged view of a photomask for negative resists.

FIGS. 4(a) and 4(b) are diagrams to be used to describe a situation in which a black matrix is formed using the projection exposure apparatus shown in FIG. 1, in which FIG. 4(a) is a partially enlarged view of the shape of light transmitted through the projection lens array, and FIG. 4(b) is a partially enlarged view of a photomask for negative resists.

FIGS. 6(a)-6(d) are diagrams for describing correction of a mask pattern line width, in particular, based on a measured line width, in methods of correcting a mask pattern line width for forming a black matrix using the photomask according to the present embodiment.

FIGS. 9(a)-9(e) are diagrams for describing the first aspect of correction based on a random number in the method for correcting a mask pattern line width for forming colored pixels using the photomask according to the present embodiment.

FIGS. 10(a)-10(e) are diagrams for describing the second aspect of the correction based on the random number in the method for correcting the mask pattern line width for forming colored pixels using the photomask according to the present embodiment, which is the correction based on a random number in which the first aspect is modified to divide a transfer region into small regions.

FIGS. 11(a)-11(e) are diagrams for describing the third aspect of the correction based on the random number in the method for correcting the mask pattern line width for forming colored pixels using the photomask according to the present embodiment.

FIGS. 12(a)-12(e) are diagrams for describing the fourth aspect of the correction based on the random number in the method for correcting the mask pattern line width for forming colored pixels using the photomask according to the present embodiment.

FIG. 14(a) is a plan view partially illustrating the shape of light transmitted through a projection lens array in the projection exposure apparatus shown in FIG. 13. FIG. 14(b) is an enlarged view of a portion of FIG. 14(a). FIG. 14(c) shows characteristics for describing a change in the line width of the negative resist pattern formed by scanning exposure with respect to the X-direction position.

FIGS. 15(a) and 15(b) are diagrams for describing a situation in which colored pixels are formed using the projection exposure apparatus shown in FIG. 13, in which FIG. 15(a) is a partially enlarged view of the shape of light transmitted through the projection lens array, and FIG. 15(b) is a partially enlarged view of a photomask for negative resists.

FIGS. 16(a) and 16(b) are diagrams for describing a situation in which a black matrix is formed using the projection exposure apparatus shown in FIG. 13, in which FIG. 16(a) is a partially enlarged view of the shape of light transmitted through the projection lens array, and FIG. 16(b) is a partially enlarged view of a photomask for negative resists.

DESCRIPTION OF THE EMBODIMENTS

Figure 1:
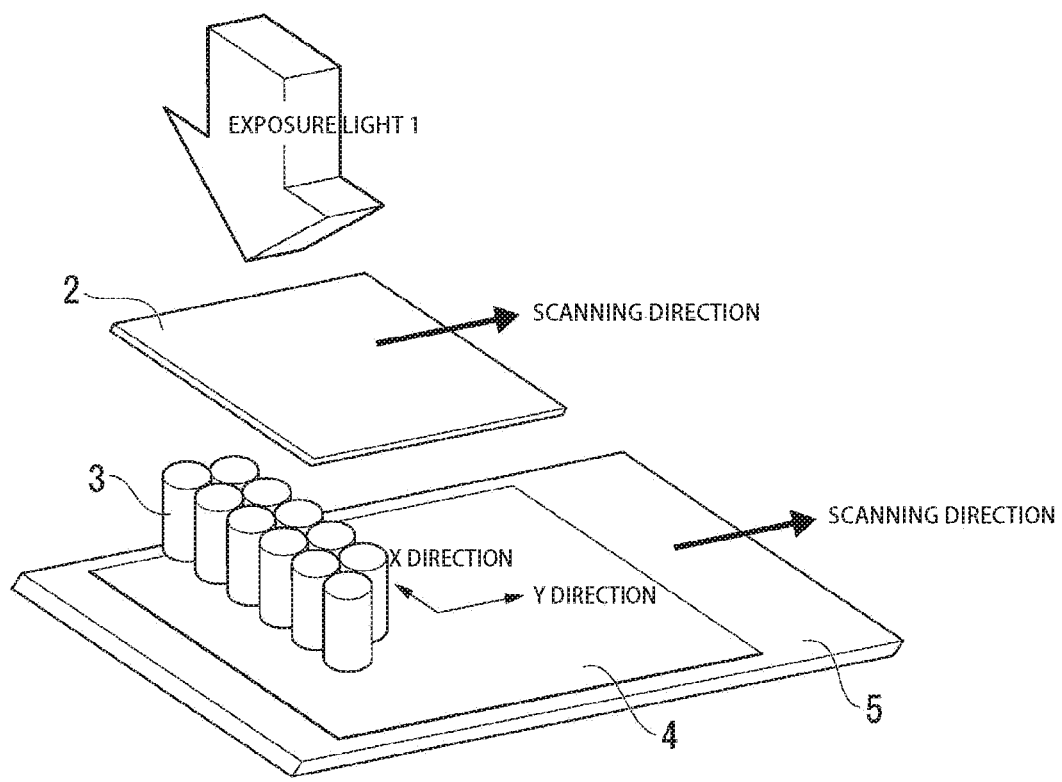
FIG. 1 is a conceptual diagram showing the configuration of a scanning exposure type projection exposure apparatus.

The embodiments will now be described with reference to the accompanying drawings, wherein like reference numerals designate corresponding or identical elements throughout the various drawings.

Hereinafter, an embodiment of a photomask according to the present invention will be described in detail with reference to the drawings. The present invention is not limited to the following embodiment within the scope not departing from the spirit of the present invention. The same constituent elements are denoted by the same reference numerals unless there is a reason for the sake of convenience, and redundant description is omitted.

The following describes the case where colored pixels and a black matrix are formed using a negative resist unless otherwise specified. The differences between the case where the negative resist is applied and the case where the positive resist is applied are only the reversal of openings (light transmitting parts) and light-shielding parts of a photomask, and a direction in which a mask pattern line width is corrected; specifically, in the correction, the line width is increased in the case of the negative resist, but is reduced in the case of the positive resist.

FIG. 1 is a conceptual diagram showing the configuration of a scanning exposure type projection exposure apparatus. In the projection exposure apparatus, a photomask 2 is irradiated with exposure light 1 emitted from a light source unit (not shown) installed above the photomask 2, and a resist applied to a substrate 4 is exposed via the patterned photomask 2 to form a pattern of a black matrix, colored pixels, spacers, micro-lenses, and the like. A projection lens array 3 is composed of lens assembly in which a plurality of columnar lenses are staggered, and the center of the projection lens array 3 is on the center line of the photomask 2 in a scanning direction.

For example, let us assume the case where the size of the photomask 2 is one-fourth of the size of the substrate 4, and four-sided (2, 2) scanning exposure is performed in the (X, Y) directions. First, the center of the photomask 2 is moved to coincide with the center of the first quarter region of the substrate 4, and thus an initial position is determined. After that, the photomask 2 and the substrate 4 are scanned simultaneously in the Y direction with respect to the fixed projection lens array 3. Then, the pattern formed on the photomask 2 is transferred to the resist successively in quarters of region of the substrate 4. This operation is repeated at the remaining three initial positions by way of movement. Accordingly, the pattern is transferred to the resist on the entire substrate 4.

Figure 2A:
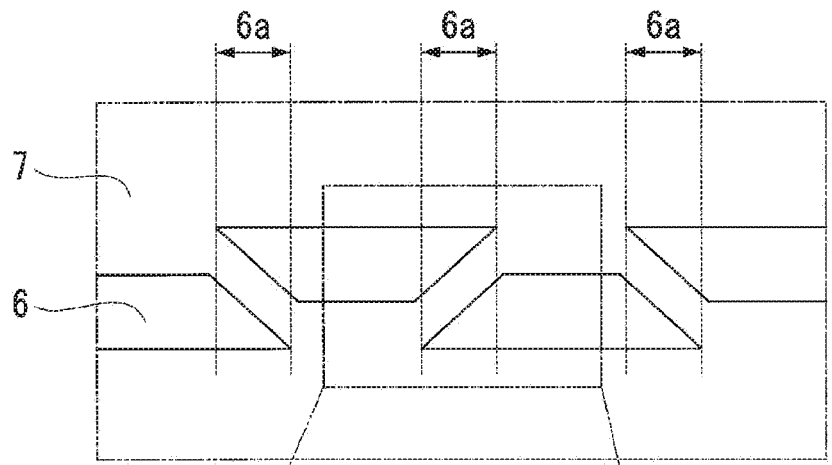
FIGS. 2(a)-2(c) are diagrams.
Figure 2B:
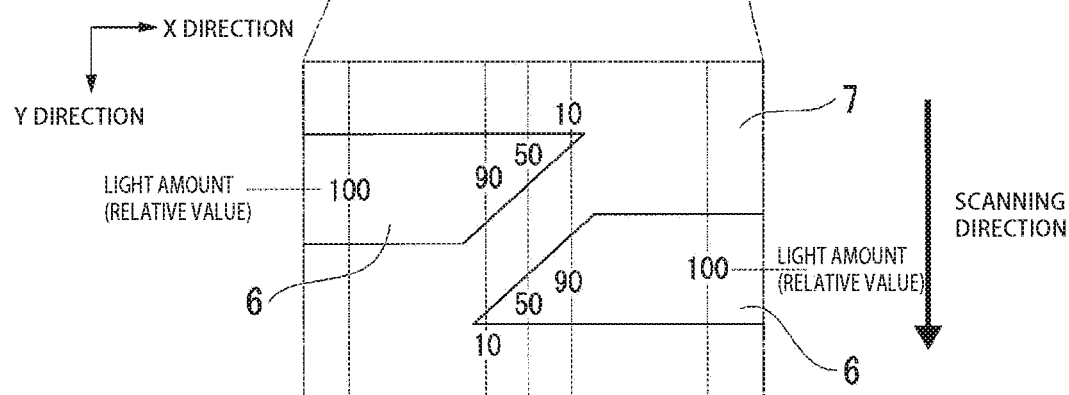

In the projection exposure apparatus, a field stop for connecting the exposure regions of the columnar lenses is inserted into the optical path of light transmitted through the projection lens array 3. Therefore, exposure regions 6 of the projection lens array 3 are trapezoidal in plan view, and the plurality of exposure regions 6 are staggered, as shown in FIG. 2(a). FIG. 2(b) shows an enlarged view of exposure regions around a connecting portion of a pair of adjacent columnar lenses. The adjacent exposure regions at the connecting portion are shaped so that triangular portions face each other at an end of each columnar lens, and configured so that the total amount of light transmitted through the pair of lenses as a result of scanning in the Y direction is 100 (relative value) at any position, which is equal to the amount of light transmitted through a quadrilateral region (non-connecting portion) in the exposure region 6 that does not include a connecting portion 6a.

Figure 5A:
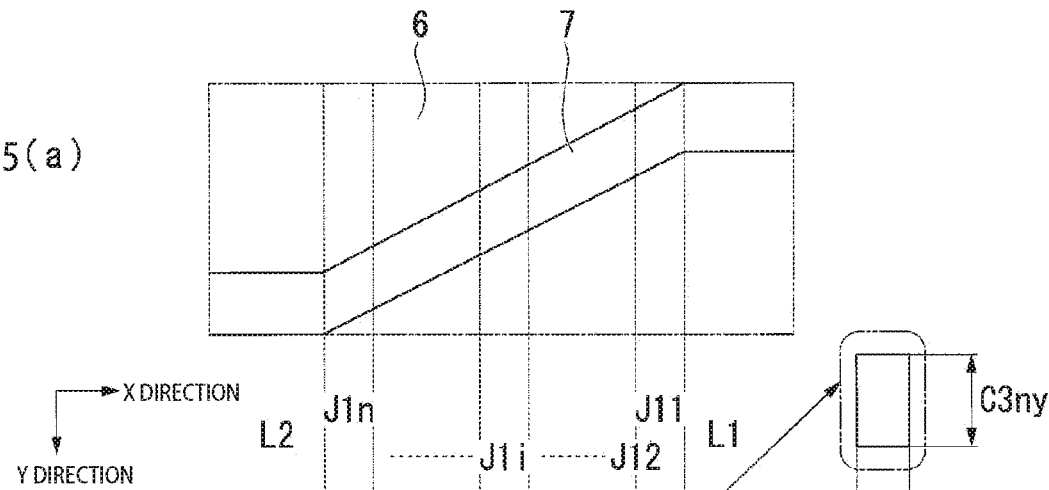
FIGS. 5(a)-5(d) are diagrams for describing correction of a mask pattern line width, in particular, based on a measured line width, in methods of correcting a mask pattern line width for forming colored pixels using the photomask according to the present embodiment.

FIGS. 5(a)-5(d) are diagrams for describing correction of a mask pattern line width based on a measured line width, in particular, in a method for correcting a mask pattern line width for forming colored pixels using the photomask according to the present embodiment. FIG. 5(a) shows the plan view shapes of the exposure region 6 and a light-shielding region 7 subject to light transmitted through the projection lens array. The reactivity of the resist gradually decreases as L1, J11, J12, . . . toward the center of the connecting portion between two columnar lenses.

Figure 5B:
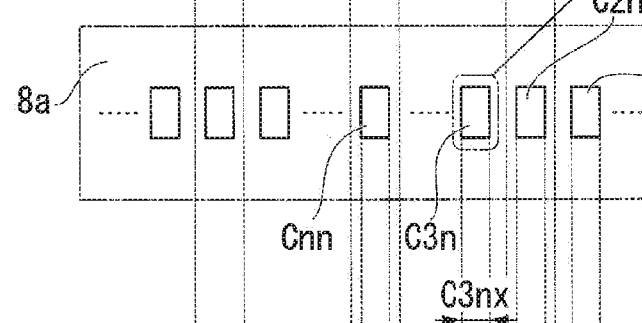

FIG. 5(b) shows a plan view of a photomask 8a having a colored pixel pattern according to the present embodiment. As shown in FIG. 3(b), on the photomask having a colored pixel pattern, a plurality of pattern arrangements in the X direction and the Y direction are aligned; in FIG. 5(b), in order to simplify the explanation, only opening patterns C1n, C2n, C3n, Cnn aligned in the X direction among the plurality of pattern arrangements are illustrated. Reference signs C1n, C2n, Cnn represent opening patterns; as described above, in the opening patterns C1n, exposure is performed with a relative light amount of 100 per exposure, but, the reactivity of the resist to the transmitted light decreases in the order of the opening patterns C2n, C3n, . . . , Cnn, meaning that the line widths in the X direction and the Y direction are reduced.

Therefore, in the photomask according to the present embodiment, the opening patterns C2n, C3n, Cnn are prepared having line widths (opening pattern widths) corrected to a gradually increasing extent, to solve the above-described problem of a reduction in the line width. In an exposure apparatus in which the photomask according to the present embodiment is used, the center of the projection lens array 3 is on the center line of the photomask 2 in the scanning direction. As a result, a position on the photomask at which variations in the line width in the exposure region that are attributed to the connecting portion of lenses occur is determined, which is effective in solving the problem of a reduction in the line width.

Specifically, a value obtained by multiplying a designed line width by a correction coefficient K is set to be the line width of the opening pattern C2n and afterward. More specifically, first, a curve is formed by smoothing a characteristic curve A measured in advance (refer to FIG. 2(c)), and a correction curve B such as that shown in FIG. 5(c) is formed with the vertical axis representing a value obtained by dividing the designed line width by the measured line width determined using the smoothed curve on C2n afterward.

Figure 5C:
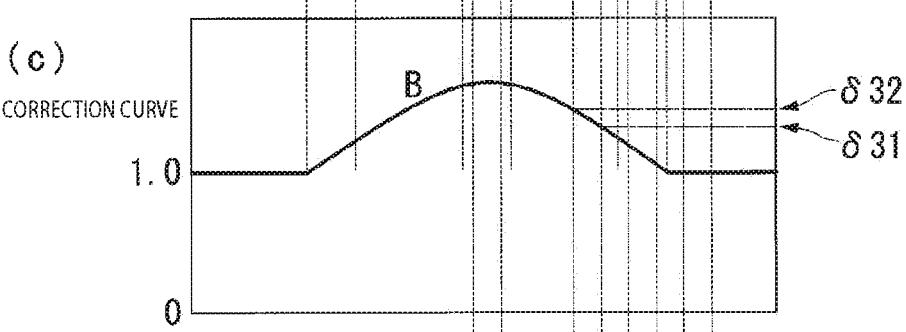
Figure 5D:
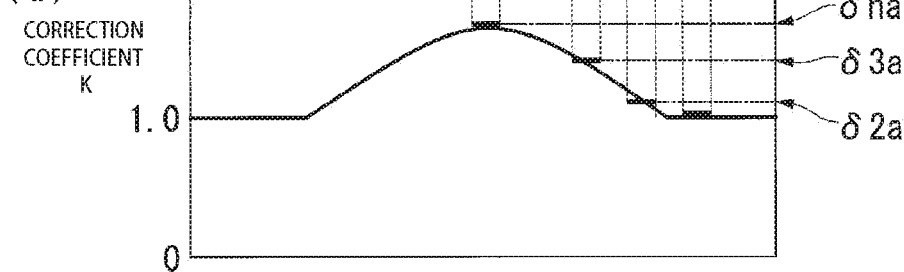

Next, two intersections (for example, an intersection δ31 and an intersection δ32 for C3n) of the correction curve B and vertical lines drawn from the positions of the both sides of each of the opening patterns C2n, C3n, Cnn in the X direction to the correction curve B are determined, and the mean values at the two intersections is denoted as the correction coefficient K for the opening patterns C2n, C3n, . . . , and Cnn (refer to FIG. 5(d)). For example, the correction coefficient K for the opening pattern C3n is an intersection δ3a. The change in the correction curve B is linear in a small region, and thus the correction coefficient K is approximately the median of the values at the intersection δ31 and the intersection δ32. Thus, the correction coefficient K for the opening patterns C2n, C3n, . . . , Cnn is the reciprocal of the measured line width where the designed line width is a reference (1.0), and the line width of the corrected opening pattern on the photomask is a line width changing stepwise for patterns in a direction orthogonal to the scanning direction.

The opening pattern C1n at the non-connecting portion has a line width very close to the designed line width, and thus the correction coefficient K for the opening pattern C1n may be set to 1.0 (no correction). However, when a line width close to the designed line width may not be obtained, the correction coefficient K other than 1.0 may be used according to substantially the same procedure as that in the above-described case of the connecting portion. Thus, if the scanning exposure is performed using the photomask according to the present embodiment, the line width at the non-connecting portion is close to variations in the line width at the connecting portion, therefore leading to reduced variations in the line width of the colored pixel after the exposure.

Figure 2C:
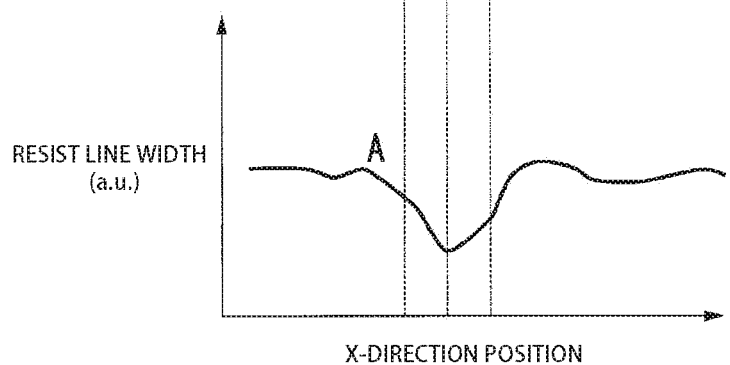

For illustrative purposes, the correction curve B in FIG. 5(c) is a correction curve for line widths C2nx, C3nx, Cnnx of the opening patterns C2n, C3n, Cnn in the X direction, but is also effective in correcting line widths C2ny, C3ny, Cnny in the Y direction that is the scanning direction. This is because the ratio of the resist reactivity at each pixel is the same in both the X direction and the Y direction. This means that when the resist pattern line widths C1ny, C2ny, C3ny, Cnny in the Y direction are measured, a curve shaped similar to the characteristic curve A in FIG. 2(c) is obtained. Therefore, the correction curve B is the same as a curve for the line width in the X direction, and the value of the correction coefficient K at each pixel in the Y direction depends only on the positions of C2n, C3n, Cnn in the Y direction. In this manner, in the photomask according to the present embodiment, the corrected line width is changing stepwise for pixels in the scanning direction, and variations in the line width of the colored pixel after the exposure are also reduced in the scanning direction.

Figure 4A:
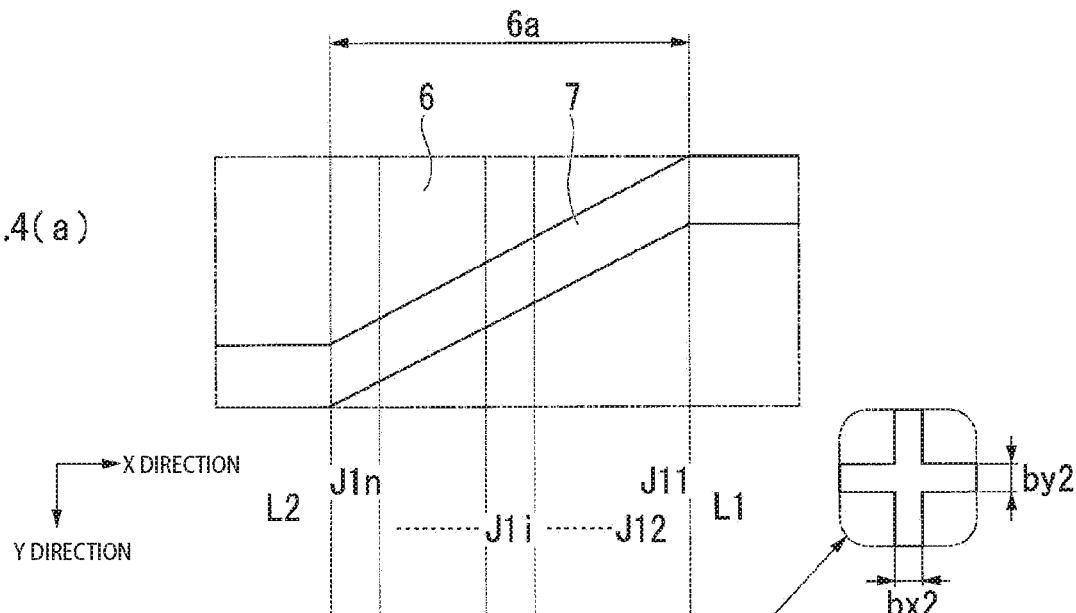
Figure 4B:
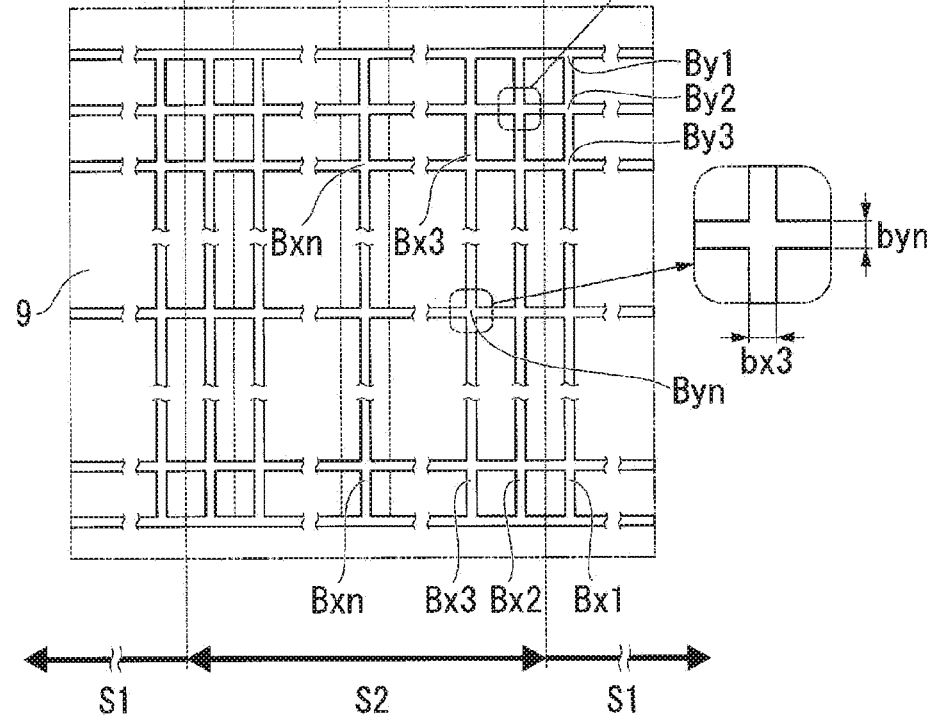

The photomask according to the present embodiment that is used to form the colored pixels has been described above; the same applies to the photomask for forming a black matrix shown in FIG. 4(b). FIGS. 6(a)-6(d) are diagrams for describing correction based on a measured line width, in particular, in a method for correcting a mask pattern line width for forming a black matrix using the photomask according to the present embodiment. The difference between forming the colored pixels and forming the black matrix is that in the case of the colored pixels, the line widths in the X direction and the Y direction are corrected for individual pixels, but, in the case of the black matrix, it is sufficient that line widths bx2, bx3, bxn in the X direction be corrected for resist patterns Bx2, Bx3, Bxn arranged in the X direction, respectively, and line widths by2, by3, byn in the Y direction be corrected for By2, By3, Byn arranged in the Y direction, respectively.

In the case of the resist patterns Bx2, Bx3, Bxn in the X direction, two intersections (for example, an intersection δ31 and an intersection δ32 for Bx3) of the correction curve B and vertical lines drawn from the positions of the both sides of each of the resist patterns Bx2, Bx3, Bxn in the X direction to the correction curve B are determined, and the mean values at the two intersections (the intersection δ3a for Bx3) is denoted as the correction coefficient K for the resist patterns Bx2, Bx3, Bxn (refer to FIG. 6(d)). Thus, the correction coefficient K for the resist patterns Bx2, Bx3, Bxn is the designed line width/the measured line width, that is, a value obtained by dividing the designed line width by the measured line width. As a result, when the scanning exposure is performed using the photomask according to the present embodiment, the line widths in the black matrix after being exposed become uniform. The same applies to the resist patterns By1, By2, Byn in the Y direction.

Figure 7A:
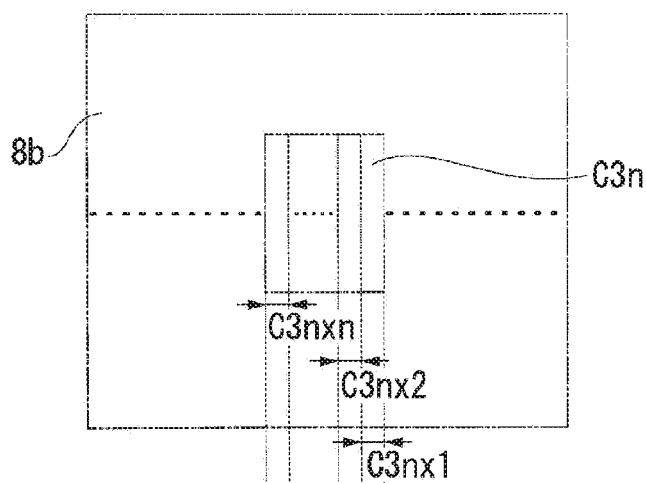
FIGS. 7(a) and 7(b) are diagrams for describing correction of a mask pattern line width, in particular, based on a measured line width, in methods of correcting the line width by dividing a mask pattern for forming colored pixels using the photomask according to the present embodiment.
Figure 7B:
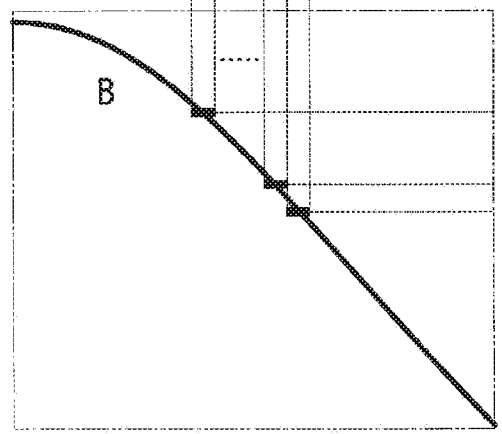

In the above-described method for correcting a line width in the photomask according to the present embodiment, the mask pattern may be divided to correct the line width. FIGS. 7(a) and 7(b) are diagrams for describing a method for dividing a mask pattern for forming colored pixels using the photomask according to the present invention to correct the line width. Here, the case of dividing the C3n pixel in FIG. 5(b) in the X direction is representatively described. As illustrated, the C3n pixel is divided into n portions, and correction coefficients δ3a1, δ3a2, . . . δ3an are determined using the correction curve for the respective regions of the n portions, similarly to the case in FIGS. 5(a)-5(d). This makes the stepwise change in the line width that is due to the correction more finely segmented, thus more like a curve, than in the case in FIGS. 5(a)-5(d), leading to become a more practical countermeasure against variations in the line width that are attributed to the connecting portion. As a result, the above-described problem of the variations in the line width is further solved.

The above-described correction method in which the opening pattern is divided is applicable in substantially the same manner to the colored pixels in the Y direction and the black matrix in the X direction and the Y direction, and is also effective in improving variations in the line width. Note that the dimension of the black matrix is usually smaller in width direction than the line width of the colored pixel, and larger in length direction than the line width of the colored pixel. Therefore, the number of divisions along the width direction is preferably set less than the number of colored pixels, and the number of divisions along the length direction is preferably set greater than the number of colored pixels.

With the photomask according to the present embodiment, variations in the line width that occur at the connecting portion between the exposure regions of the projection lens array are reduced by introducing the above-described line width correction. However, variations are found in the line width of the scanning exposure as is clear from the characteristic curve A of measured values in FIG. 2(c). Such variations are attributed, for example, to a drawing method unique to a drawing apparatus or a resist process including resist properties; if the variations are repetitively formed, the variations are visually recognized as unevenness.

Therefore, in the photomask according to the present embodiment, furthermore, in order to solve the irregularities of variations in the line width, a correction component based on a random number is included in the correction of the line width. Typically, in order to produce the photomask, an electron beam drawing apparatus is used, and a raw pattern is created based on electron beam drawing data being produced. The correction component based on the random number is introduced into a corrected line width by changing the drawing data in substantially the same manner as the correction based on the measured line width. The correction component based on the random number is introduced into the corrected line width by referring to the method described in JP 2011-187869 A.

Figure 8:
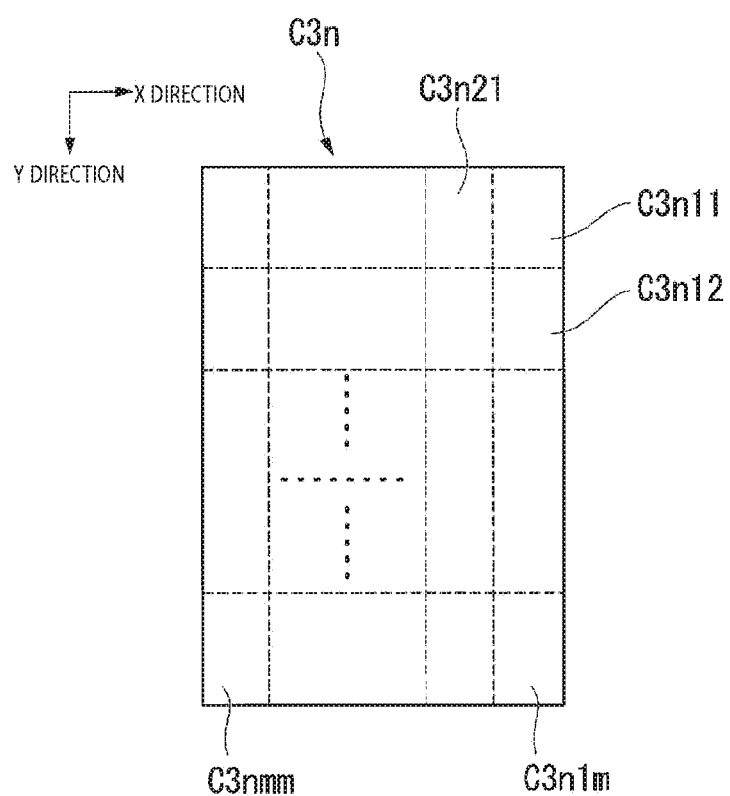
FIG. 8 is a plan view showing an example of a colored pixel divided in the X direction and the Y direction.
Figure 13:
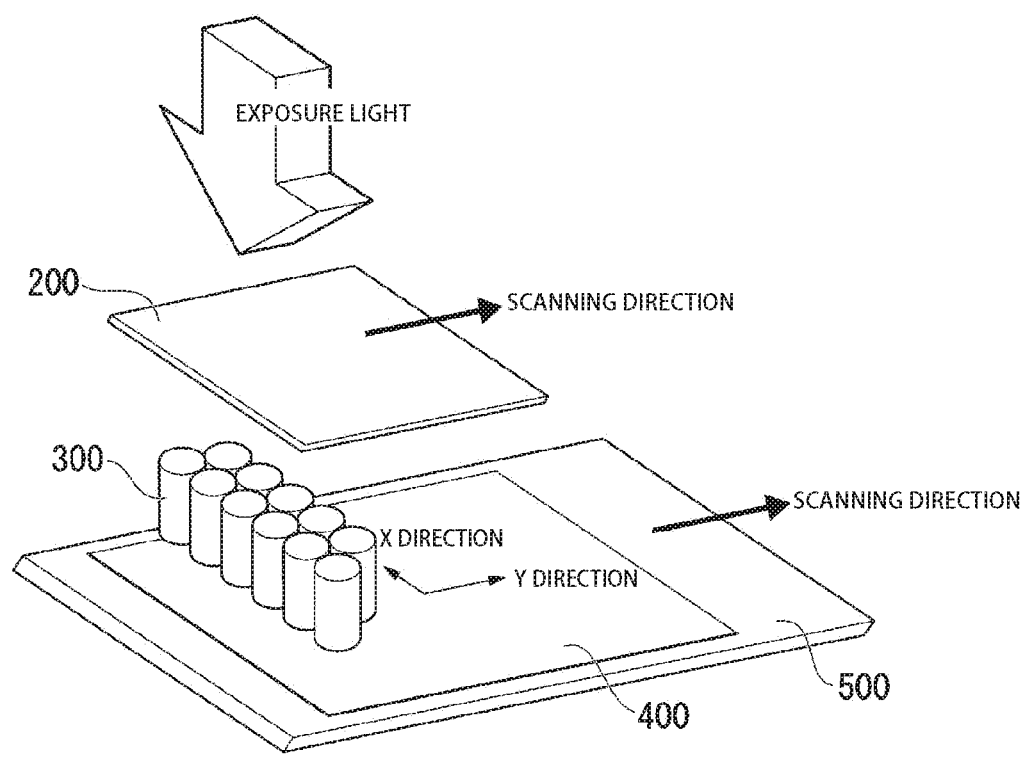
FIG. 13 is a conceptual diagram showing the configuration of a conventional scanning exposure type projection exposure apparatus.
Figure 14A:
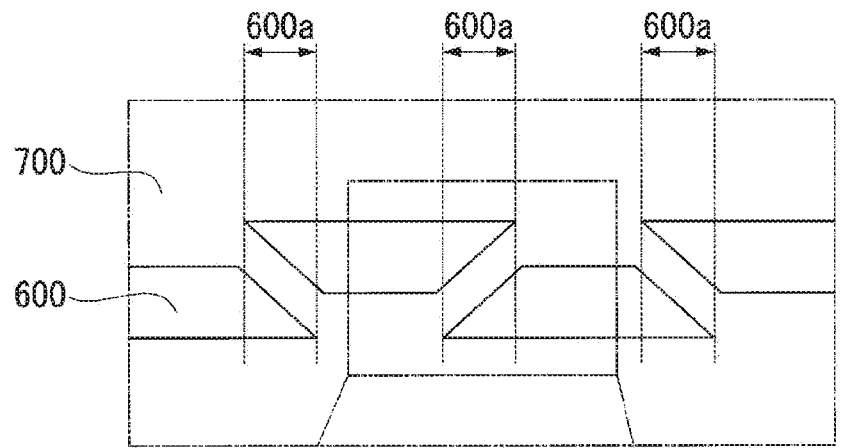
FIGS. 14(a)-14(c) are diagrams.
Figure 14B:
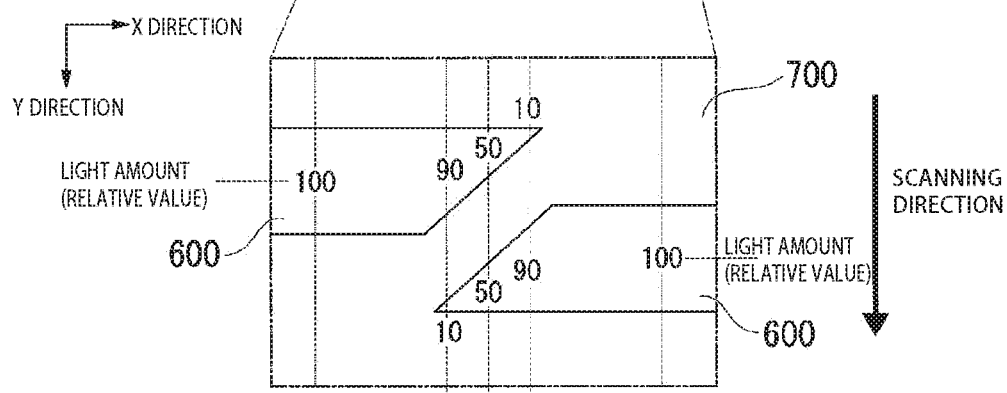
Figure 14C:
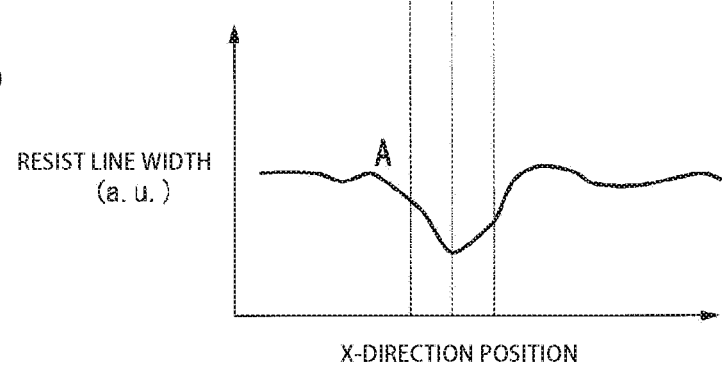
Figure 15A:
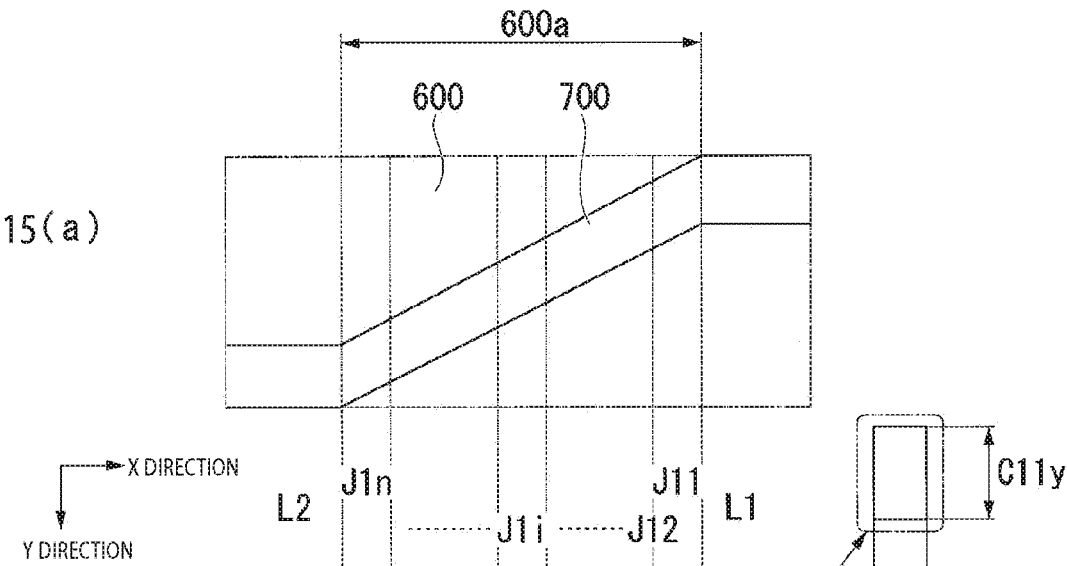
Figure 15B:
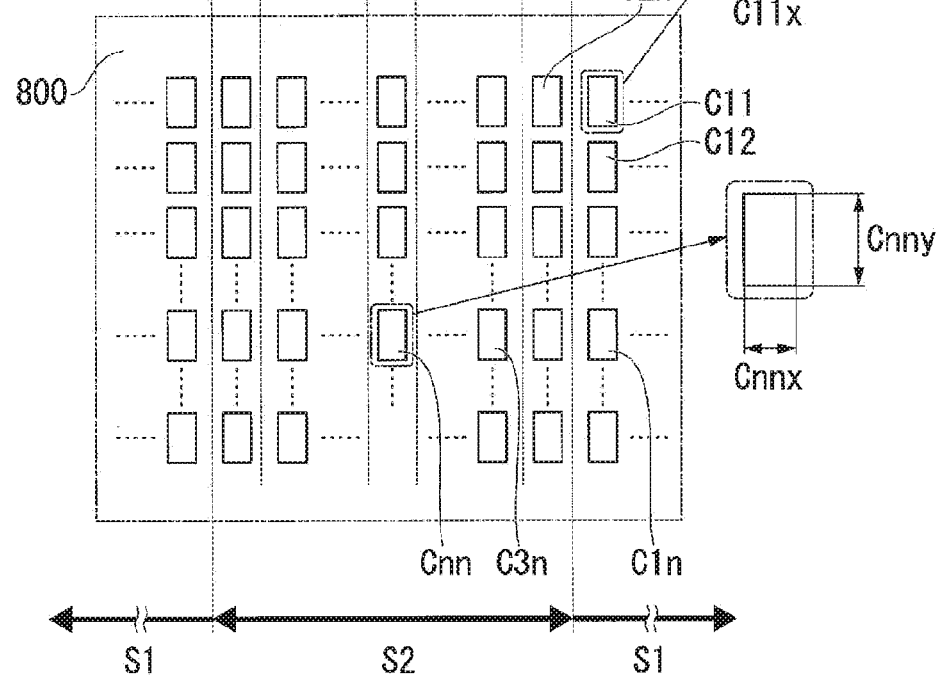
Figure 16A:
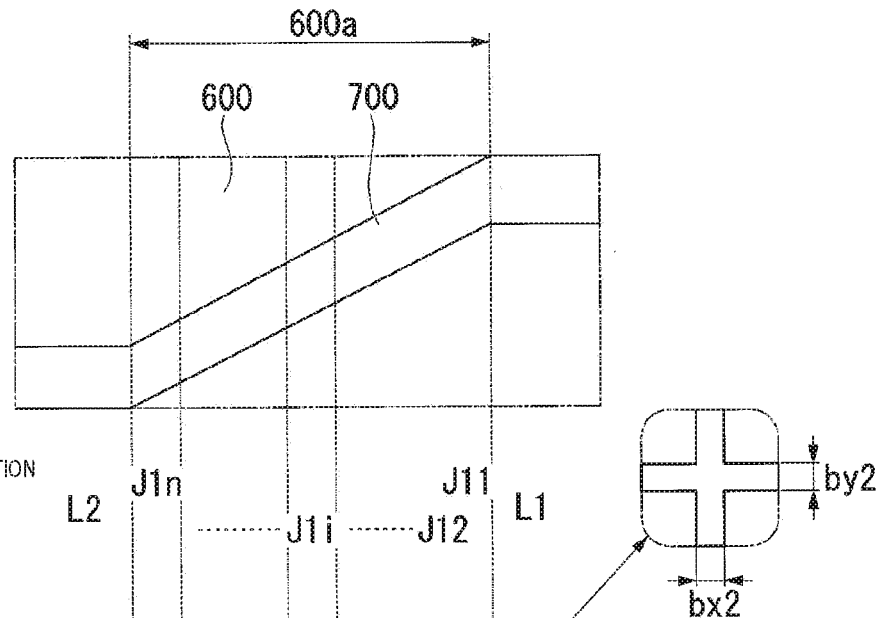
Figure 16B:
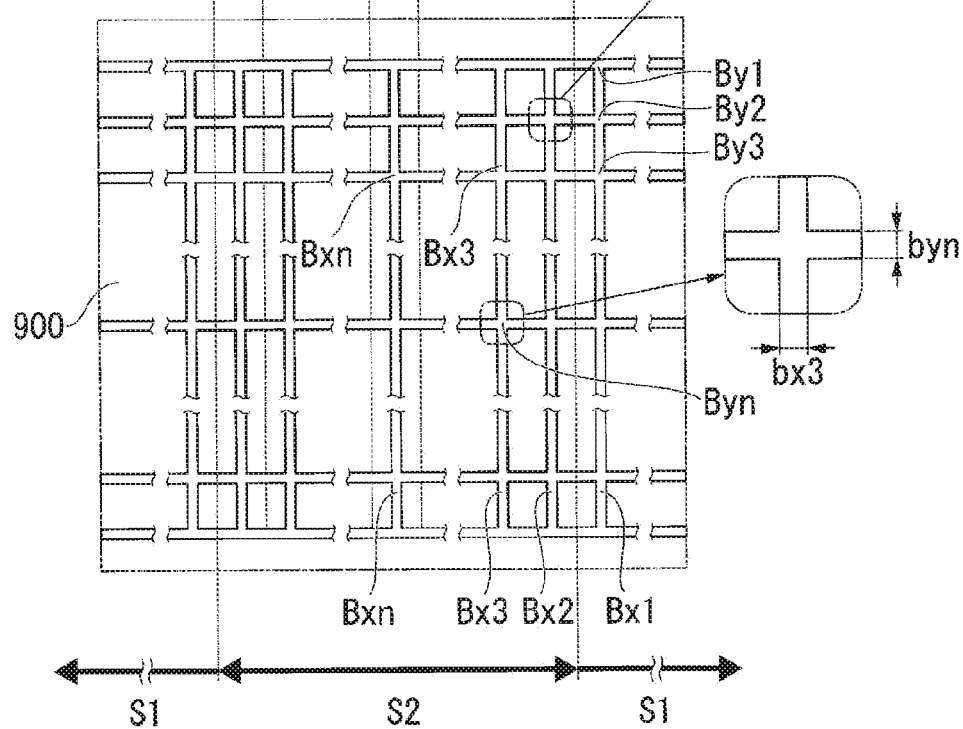

Specifically, the correction component based on the random number is introduced into the corrected line width in the photomask according to the present embodiment by multiplying the above-described correction coefficient K based on the measured line width by a second correction coefficient R generated using the random number. With respect to a mesh unit mentioned in JP 2011-187869 A, in the case of the colored pixels, the mesh unit used in the photomask according to the present embodiment may be an individual pixel that has not been divided (refer to FIG. 3(b)) or may be a pixel that has been divided in the X direction as shown in FIGS. 7(a) and 7(b) or in the X and Y directions as shown in FIG. 8. The same applies to the case of the black matrix, however, particularly in the length direction, it is effective to set the mesh unit of the pixels after being divided.

FIGS. 9(a)-9(e) are diagrams for describing the first embodiment of the correction based on a random number in the method for correcting a mask pattern line width for forming colored pixels using the photomask according to the present embodiment. FIGS. 9(a) to 9(d) are the same as FIGS. 5(a) to 5(d) except that the illustration range includes more lenses of the projection lens array and the resist line width is added in FIG. 9(b). FIGS. 9(a)-9(e) illustrates an example in which the number of openings is four per region in both of the lens connecting and non-connecting portions.

Each of KL1, KL2, and KL3 in FIG. 9(d) is a group of correction coefficients K corresponding to openings at the non-connecting portion, and thus may be set to 1.0 (no correction) as with the correction coefficient for C1n in FIG. 5(b) and in the case where the line width varies, may be set to the designed line width/the measured line width. Each of KJ1, KJ2, KJ3, and KJ4 is a group of correction coefficients K corresponding to openings at the connecting portion and is set to the designed line width/the measured line width as with the correction coefficients for the opening patterns C2n, C3n, . . . , Cnn in FIG. 5(b).

Each of RL1, RL2, and RL3 in FIG. 9(e) is the second correction coefficients R for the non-connecting portion which is generated using the random number. Each of RJ1, RJ2, RJ3, and RJ4 in FIG. 9(e) is the second correction coefficients R for the connecting portion which is generated using the random number. In the photomask according to the present embodiment, the correction coefficients to be applied to all these non-connecting and connecting portions do not each need to be the second correction coefficient involving the random number; the second correction coefficient may be one of the set of RL1, RL2, and RL3 for the non-connecting portions and the set of RJ1, RJ2, RJ3, and RJ4 for the connecting portions. In the case where the second correction coefficient generated using the random number is not used, the correction coefficient R based on the random number for the region for which the second correction coefficient is not used is set to 1.0 (no correction).

The range of the correction coefficient R desirably includes 1.0 and includes a region around 1.0 that covers the same extent from 1.0 as the center in the plus and minus directions so that a line width actually prepared using a line width obtained by multiplying the designed line width by the correction coefficient K and the correction coefficient R does not exceed the specification line width of a product.

For derivation of the second correction coefficient R, random numbers are generated using a preset function, the generated random numbers are sequentially allocated to at least one of the non-connecting portion (L1, L2, L3) and the connecting portion (J1, J2, J3, J4), and the second correction coefficients R (RL1, RL2, RL3 and/or RJ1, RJ2, RJ3, RJ4) associated with a random number in advance is determined based on the allocated random number. Thereafter, the designed line width is multiplied by the correction coefficient K and the correction coefficient R, and the line width of each region after being resized is determined. A process of reallocating the random number if plus side resize numbers or minus side resize numbers consecutively appear, and other data processes may be performed similarly to the method shown in JP 2011-187869 A.

FIG. 10(e) shows the second embodiment of the correction based on a random number in the method of correcting a mask pattern line width for forming colored pixels using the photomask according to the present embodiment. FIGS. 10(a)-10(e) are diagrams for describing correction based on a random number in which the correction of the mask pattern line width shown in FIGS. 9(a)-(e) is modified to divide a transfer region. In the photomask according to the present embodiment, at least one of the region at the non-connecting portion (L1, L2, L3) and the region at the connecting portion (J1, J2, J3, J4) is divided, a connection component based on a random number is introduced for each of small regions resulting from the division, second correction coefficients RL11, . . . , RL1n, . . . , are used for small regions at the non-connecting portion, and/or second correction coefficients RJ11, . . . , RJ1n, . . . , are used for small regions at the connecting portion. This expands the range of the correction based on the random number, leading to less periodic changes in the line width; thus, the risk of unevenness is further mitigated.

FIGS. 11(a)-11(e) are diagrams for describing the third embodiment of the correction (e) based on a random number, in particular, in the method for correcting a mask pattern line width for forming colored pixels using the photomask according to the present embodiment. FIGS. 11(a) to 11(d) are the same as FIGS. 5(a) to 5(d) except that the illustration range includes more lenses of the projection lens array and the resist line width is added in FIG. 11(b). FIGS. 11(a)-11(d) show an example in which the number of openings is four per region in both of the lens connecting and non-connecting portions.

Each of KL1, KL2, and KL3 in FIG. 11(d) is a group of correction coefficients K corresponding to openings at the non-connecting portion and thus may be set to 1.0 (no correction) as with the correction coefficient for C1n in FIG. 5(b) and in the case where the line width varies, may be set to the designed line width/the measured line width. Each of KJ1, KJ2, KJ3, and KJ4 is a group of correction coefficients K corresponding to openings at the connecting portion and is set to the designed line width/the measured line width as with the correction coefficients for the opening patterns C2n, C3n, . . . , Cnn in FIG. 5(b).

The reference signs RL1, RL2, and RL3 indicated in FIG. 11(e) represent a group of second correction coefficients R generated using random numbers and corresponding to openings at the non-connecting portions. The reference signs RJ1, RJ2, RJ3, and RJ4 indicated in FIG. 11(e) represent a group of second correction coefficients R generated using random numbers and corresponding to openings at the connecting portions. In the third embodiment of the correction based on a random number, a random number from which the correction coefficient is derived is generated based on a waveform obtained by frequency-modulating a sine wave. The reference sign RF indicated in FIG. 11(e) is one example of the waveform obtained by frequency-modulating a sine wave.

Generally, assuming that a carrier wave Vc is a sine wave in Equation (1) and a modulation wave Vs which modulates the carrier wave is a sine wave in Equation (2), a modulated wave Vm is represented by Equation (3) below, in which time is represented by the horizontal axis.

$$Vc = Vcm \cdot \cos(\omega c \cdot t) \quad (1)$$

$$Vs = Vsm \cdot \cos(\omega s \cdot t) \quad (2)$$

$$Vm = Vcm \cdot \sin((\omega c \cdot t) + mf \cdot \sin(\omega s \cdot t)) \quad (3)$$

Here, Vcm is the amplitude of the carrier wave, ωc is a carrier wave angular frequency, t is time, Vsm is the amplitude of the modulation wave, ωs is a modulation wave angular frequency, mf(=Δω/ωs) is a modulation index, and Δω is an angular frequency deviation.

Δω means the range of changes in the carrier wave frequency that are due to the frequency modulation.

Now, when the waveform obtained by frequency-modulating the sine wave is RF, in which space is represented by the horizontal axis, in substantially the same manner as when determining the correction coefficient K shown in FIG. 11(d), two intersections of the waveform RF and vertical line drawn from the positions of the both sides of each of the openings to the waveform RF resulting from the frequency modulation are determined, and the mean values at the two intersection is assumed to be the second correction coefficient R corresponding to the opening (refer to FIG. 11(e)).

The range of the correction coefficient R (1.0−V cm to 1.0+V cm in FIG. 11(e)) is desirably centered on 1.0 and covers the same extent around 1.0 in the plus and minus directions so that a line width actually prepared using a line width obtained by multiplying the designed line width by the correction coefficient K and the correction coefficient R does not exceed the specification line width of a product.

As is clear from Equation (3), the modulated wave Vm has periodicity, but, since the carrier wave angular frequency ωc, the modulation wave angular frequency ws, and the angular frequency deviation Δω can be arbitrarily set, the waveform resulting from the frequency modulation can be arbitrarily created through data processing. The waveform resulting from the frequency modulation may be determined by preferably selecting ωc, ωs, and Δω according to the specification line width of a final product, the characteristics of the drawing apparatus, and a resist process including a resist type so that periodic unevenness is prevented.

FIGS. 12(a)-12(e) are diagrams for describing the fourth embodiment of the correction based on a random number, in particular, in the method for correcting a mask pattern line width for forming colored pixels using the photomask according to the present embodiment. FIGS. 12(a) to 12(d) are the same as FIGS. 11(a) to 11(d), and thus description thereof will be omitted.

In FIG. 12(e), RL1, RL2, and RL3 represent a group of second correction coefficients R generated using random numbers and corresponding to openings at the non-connecting portions, and RH, RJ2, RJ3, and RJ4 represent a group of second correction coefficients R generated using random numbers and corresponding to openings at the connecting portions. In the fourth embodiment of the correction based on a random number, the random number is generated based on white noise. The reference sign RW indicated in FIG. 12(e) is one example of the waveform based on white noise.

The white noise is highly random noise that is generated, for example, at active elements such as transistors and diodes and passive elements such as resistors and capacitors in electronic circuits, includes a wide range of frequencies, varies at random with an amplitude within specific numerical values, and has the total mean and dispersion values of 0. The white noise does not have specific periodicity.

Now, when the waveform based on white noise is RF, in substantially the same manner as when determining the correction coefficient K shown in FIG. 12(d), two intersections of the waveform RW and vertical line drawn from the positions of the both sides of each of the openings to the waveform RW based on white noise are determined, and the mean values at the two intersection is assumed to be the second correction coefficient R corresponding to the opening (refer to FIG. 12(e)).

The range of the correction coefficient R is desirably centered on 1.0 and covers the same extent around 1.0 in the plus and minus directions (1.0−W to 1.0+W in FIG. 12(e) where W is the maximum amplitude of the waveform RW) so that a line width actually prepared using a line width obtained by multiplying the designed line width by the correction coefficient K and the correction coefficient R does not exceed the specification line width of the product.

Although the white noise does not have specific periodicity, the average period in which the waveform RW oscillates needs to be properly selected in consideration of the positional relationship with the openings. The waveform RW with the average period changed can be arbitrarily created through analog-digital conversion and data processing of white noise. The waveform RW may be determined by preferably selecting an average period according to the specification line width of a final product, the characteristics of the drawing apparatus, and a resist process including a resist type so that periodic unevenness is prevented.

Although the foregoing describes, with reference to FIGS. 11(a)-11(e) and FIGS. 12(a)-12(e), the case where the random number based on the waveform obtained by frequency-modulating the sine wave and the random numbers based on the white noise are applied to the random number used in the first embodiment, these random numbers may be applied to the random numbers used in the second embodiment.

Whether to perform the correction based on the above random numbers at one or both of the connecting portion and the non-connecting portion may be selected, as appropriate, according to the specification line width of a final product, the characteristics of the drawing apparatus, and a resist process including a resist type. Making a selection to include a smaller number of subjects is advantageous because the volume of drawing data is small. Furthermore, although the correction of the line width in the X direction has been described as the correction based on the above random numbers, the line width in the Y direction can also be effectively corrected as in the case of the correction based on the measured line width.

As described above, with the photomask according to the present embodiment, the correction coefficient K based on the measured line width is introduced to allow the line width changes stepwise so that variations in the line width that occur at the connecting portion between the exposure regions of the projection lens array are reduced, and the second correction coefficient R generated using a random number is further introduced to mitigate variations in the line width that are attributed to the drawing apparatus, the resist process, or the like, thus solving the problem of periodic unevenness.

The present invention has an aspect to provide a photomask which removes unevenness due to periodic variations in line width that occur at a connecting portion between exposure regions of a projection lens array in scanning exposure type projection exposure.

A photomask according to the first aspect of the present invention is a photomask provided with a projection lens array composed of lens assembly and used in scanning type projection exposure and is characterized in that at least one of a line width in a pattern of the photomask that is transferred by scanning exposure at a connecting portion of the lens assembly and a line width in a pattern of the photomask that is transferred by the scanning exposure at a non-connecting portion of the lens assembly is a corrected line width obtained by correcting a designed line width, the corrected line width is changing stepwise in at least one of a scanning direction and a direction orthogonal to the scanning direction, and the line width changing stepwise includes a correction component based on a random number.

In the second embodiment of the present invention, in the photomask according to the first aspect, at least one of a transfer region subject to the scanning exposure at the connecting portion of the lens assembly and a transfer region subject to the scanning exposure at the non-connecting region of the lens assembly may be small divided regions, and the correction component based on the random number may be used for each of the small divided regions.

In the third embodiment of the present invention, in the photomask according to the first or second aspect, the random number may be based on a waveform obtained by frequency-modulating a sine wave.

In the fourth embodiment of the present invention, in the photomask according to the first or second aspect, the random number may be based on white noise.

In scanning exposure of the photomask according to the present invention, the problem of unevenness due to variations in line width that occur at a connecting portion between exposure regions of a projection lens array can be solved. As a result of manufacturing colored pixels, a black matrix, spacers, micro-lenses, and the like using the photomask according to the present invention, unevenness is not visually recognized on a color filter substrate, an OCF layer, or the like.

INDUSTRIAL APPLICABILITY

Using the photomask according to the present invention, colored pixels, a black matrix, spacers, and micro-lenses that are free from line width abnormalities or variations is prepared. Accordingly, problematic unevenness on a color filter substrate, a color filter layer on an array substrate, an OCF layer, or the like will no longer be visually recognized. Therefore, the photomask according to the present invention is suitably used to manufacture a color filter and a micro-lens, for color liquid-crystal display panels required to have high display quality, high-definition liquid-crystal display apparatuses using the color liquid-crystal display panels, and solid-state image sensors.

REFERENCE SIGNS LIST

1 Exposure light
2 Photomask
3 Projection lens array
4 Substrate
5 Stage
6 Exposure region
6a Connecting portion
7 Light-shielding region
8 Photomask having colored pixel pattern
8a, 8b Part of a photomask having a colored pixel pattern
9 Photomask having a black matrix pattern
9a Part of a photomask having a black matrix pattern
A Characteristic curve according to measured values
B Correction curve
S1 Scanning region including non-connecting portions
S2 Scanning region including connecting portions
L1, L2, L3 Non-connecting portion
J1, J2, J3, J4 Connecting portion
C3$n$ One colored pixel pattern
RF Waveform obtained by frequency-modulating a sine wave
RW Waveform based on white noise Obviously, numerous modifications and variations of the present invention are possible in light of the above teachings. It is therefore to be understood that within the scope of the appended claims, the invention may be practiced otherwise than as specifically described herein.

What is claimed is:

1. A photomask, comprising:
a photomask body having a surface on which a mask pattern is formed and to be scanned and subjected to pattern transfer to a resist through a lens assembly including a connecting portion and a non-connecting portion,
wherein the mask pattern has a first region subjected to the pattern transfer at the connecting portion of the lens assembly and a second region subjected to the pattern transfer at the non-connecting portion of the lens assembly, the mask pattern has, in at least one of the first and second regions, a corrected line width adjusted such that the resist is to have a target line width as designed, the corrected line width has a stepwise change in at least one of a scanning direction and a direction orthogonal to the scanning direction, and the stepwise change includes a correction component based on a random number.

2. The photomask according to claim 1, wherein the mask pattern has the corrected line width in at least one of the first and second regions which is divided into a plurality of divisions, and the correction component is based on the random number corresponding to each of the divisions.

3. The photomask according to claim 2, wherein the random number is generated based on a waveform obtained by frequency-modulating a sine wave.

4. The photomask according to claim 3, wherein the mask pattern has the corrected line width in the first and second regions.

5. The photomask according to claim 3, wherein the corrected line width has the stepwise change in the scanning direction and the direction orthogonal to the scanning direction.

6. The photomask according to claim 2, wherein the random number is generated based on white noise.

7. The photomask according to claim 2, wherein the mask pattern has the corrected line width in the first and second regions.

8. The photomask according to claim 2, wherein the corrected line width has the stepwise change in the scanning direction and the direction orthogonal to the scanning direction.

9. The photomask according to claim 2, wherein the mask pattern has the corrected line width in the first and second regions, and the corrected line width has the stepwise change in the scanning direction and the direction orthogonal to the scanning direction.

10. The photomask according to claim 1, wherein the random number is generated based on a waveform obtained by frequency-modulating a sine wave.

11. The photomask according to claim 10, wherein the mask pattern has the corrected line width in the first and second regions.

12. The photomask according to claim 10, wherein the corrected line width has the stepwise change in the scanning direction and the direction orthogonal to the scanning direction.

13. The photomask according to claim 10, wherein the mask pattern has the corrected line width in the first and second regions, and the corrected line width has the stepwise change in the scanning direction and the direction orthogonal to the scanning direction.

14. The photomask according to claim 1, wherein the random number is generated based on white noise.

15. The photomask according to claim 14, wherein the mask pattern has the corrected line width in the first and second regions.

16. The photomask according to claim 14, wherein the corrected line width has the stepwise change in the scanning direction and the direction orthogonal to the scanning direction.

17. The photomask according to claim 14, wherein the mask pattern has the corrected line width in the first and second regions, and the corrected line width has the stepwise change in the scanning direction and the direction orthogonal to the scanning direction.

18. The photomask according to claim 1, wherein the mask pattern has the corrected line width in the first and second regions.

19. The photomask according to claim 1, wherein the corrected line width has the stepwise change in the scanning direction and the direction orthogonal to the scanning direction.

20. The photomask according to claim 1, wherein the mask pattern has the corrected line width in the first and second regions, and the corrected line width has the stepwise change in the scanning direction and the direction orthogonal to the scanning direction.

* * * * *